US008455841B2

(12) United States Patent
Saho et al.

(10) Patent No.: US 8,455,841 B2
(45) Date of Patent: Jun. 4, 2013

(54) ION MICROSCOPE

(75) Inventors: Norihide Saho, Tsuchiura (JP);
Hiroyuki Tanaka, Mito (JP); Noriaki Arai, Hitachinaka (JP); Hiroyasu Shichi, Tokyo (JP); Yoichi Ose, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/381,623

(22) PCT Filed: Jun. 4, 2010

(86) PCT No.: PCT/JP2010/003730
§ 371 (c)(1),
(2), (4) Date: Dec. 29, 2011

(87) PCT Pub. No.: WO2011/001600
PCT Pub. Date: Jan. 6, 2011

(65) Prior Publication Data
US 2012/0097863 A1    Apr. 26, 2012

(30) Foreign Application Priority Data

Jun. 30, 2009  (JP) ................................ 2009-154537

(51) Int. Cl.
*H01J 37/26*    (2006.01)
(52) U.S. Cl.
USPC ........ 250/423 F; 250/306; 250/307; 250/309; 250/423 R; 250/424
(58) Field of Classification Search
USPC .......... 250/306, 307, 309, 423 R, 424, 423 F, 250/492.1, 492.3
See application file for complete search history.

(56) References Cited

U.S. PATENT DOCUMENTS

| 5,247,256 A | 9/1993 | Marek |
| 5,737,927 A | 4/1998 | Takahashi et al. |
| 8,044,370 B2 * | 10/2011 | Winkler et al. ............ 250/423 F |

(Continued)

FOREIGN PATENT DOCUMENTS

| JP | 58-085242 A | 5/1983 |
| JP | 62-114226 A | 5/1987 |

(Continued)

OTHER PUBLICATIONS

Hong-Shi Kuo et al., "Preparation and Characterization of Single-Atom Tips", Nano Letters, 2004, vol. 4, No. 12, pp. 2379-2382.

(Continued)

*Primary Examiner* — Michael Logie
(74) *Attorney, Agent, or Firm* — Miles & Stockbridge P.C.

(57) ABSTRACT

Provided are a large-current and highly stable gas field ionization ion source, and a high-resolution ion microscope with a large focal depth. The present invention relates to an ion microscope provided with a gas field ionization ion source, in which disposed are a refrigerator for cooling the gas field ionization ion source independent of the main body of the ion microscope, and a refrigerant circulation circuit cooling mechanism for circulating a refrigerant between the gas field ionization ion source and the refrigerator. Consequently it is possible to reduce the mechanical vibration of the refrigerator, which propagates to the gas field ionization ion source, and to achieve both the improvement of the brightness of the ion source and the improvement of ion beam focusing performance.

10 Claims, 9 Drawing Sheets

U.S. PATENT DOCUMENTS

| | | | |
|---|---|---|---|
| 2002/0050565 A1 | 5/2002 | Tokuda et al. | |
| 2003/0183776 A1 | 10/2003 | Tomimatsu et al. | |
| 2009/0173888 A1* | 7/2009 | Shichi et al. | 250/397 |
| 2011/0147609 A1* | 6/2011 | Shichi et al. | 250/400 |

FOREIGN PATENT DOCUMENTS

| | | |
|---|---|---|
| JP | 63-139754 U | 9/1988 |
| JP | 64-10555 A | 1/1989 |
| JP | 01-221847 A | 9/1989 |
| JP | 03-074454 A | 3/1991 |
| JP | 04-230880 A | 8/1992 |
| JP | 08-203461 A | 8/1996 |
| JP | 09-312210 A | 12/1997 |
| JP | 2002-150990 A | 5/2002 |
| JP | 2007-003397 A | 1/2007 |
| JP | 2009-163981 A | 7/2009 |
| JP | 2009-164110 A | 7/2009 |
| JP | 2009-289670 A | 12/2009 |
| WO | WO 99/05506 A1 | 2/1999 |
| WO | WO 2009-147894 A1 | 12/2009 |
| WO | WO 2010-082466 A1 | 7/2010 |

OTHER PUBLICATIONS

John Morgan, et al., "An Introduction to the Helium Ion Microscope", Microscopy Today, vol. 14, No. 4, Jul. 2006, pp. 24-31.

* cited by examiner

ION MICROSCOPE

CROSS-REFERENCE TO RELATED APPLICATIONS

This application is a National Stage Application of PCT/JP2010/003730 filed on Jun. 4, 2010, the entire disclosure being incorporated herein by reference.

TECHNICAL FIELD

The present invention relates to a gas field ionization ion source for generation of ions, and an ion microscope used to observe the surface and inside of a sample of semiconductor devices, new materials and the like. The invention also relates to a combined instrument of an ion beam processing apparatus and the ion microscope, and a combined instrument of the ion microscope and an electron microscope. The invention also relates to an analysis and inspection system which applies the ion microscope and the electron microscope.

BACKGROUND ART

The surface structure of the sample can be observed by irradiating electrons to the sample and detecting the secondary charged particles emitted from the sample while scanning. It is called a scanning electron microscope (hereinafter abbreviated as SEM). On the other hand, the surface structure of the sample can also be observed by irradiating an ion beam to the sample and detecting the secondary charged particles emitted from the sample while scanning. It is called a scanning ion microscope (hereinafter abbreviated as SIM). Especially, it becomes suitable to observe the sample by irradiating ion species with light mass, such as hydrogen or helium, to the sample, so that a sputtering operation becomes relatively small. Here, a secondary electron excitation region due to the penetration of hydrogen or helium ions into the sample surface is localized depending on the sample surface in comparison with electron irradiation, so that a SIM image using hydrogen or helium ions becomes very sensitive to sample surface information more than the SEM image. In addition, since the ion is heavier than the electron in the viewpoint of a microscope, it has characteristics that a diffraction effect can be disregarded in view of the beam focusing and an image with very large depth of focus is obtained.

And, when an electron or ion beam is irradiated to the sample and the electrons or ions transmitted through the sample are detected, information reflecting the sample interior structure can also be obtained. It is called a transmission electron microscope or a transmission ion microscope. Especially, when ion species having light mass such as hydrogen or helium is irradiated to the sample, its ratio transmitting through the sample increases, so that it is suitable for observation.

The gas field ionization ion source is expected to provide a fine beam because the energy with of an ion is narrow and an ion generation source size is small, and it is an ion source suitable for the above-described scanning ion microscope and transmission ion microscope. Japanese Patent Application Laid-Open No. S58-85242 (PATENT LITERATURE 1) discloses that when an emitter tip which has a minute projection formed at its end in a gas field ionization ion source is used, ion source characteristics become good.

"H.-S. Kuo, I.-S. Hwang, T.-Y. Fu, J.-Y. Wu, C.-C. Chang, and T. T. Tsong, Nano Letters 4 (2004) 2379 (NON PATENT LITERATURE 1)" discloses that the minute projection at the emitter tip end is produced by using a second metal different from the emitter tip material. An ion source with high luminance is realized by producing an atom nanopyramid structure at the emitter tip end.

"J. Morgan, J. Nolte, R. Hill, and B. Ward, Microscopy Today, Jul. 14 (2006) 24 (NON PATENT LITERATURE 2)" discloses a scanning ion microscope provided with a gas field ionization ion source which emits helium ions.

Japanese Patent Application Laid-Open No. H03-74454 (PATENT LITERATURE 2) discloses a mechanism that an ionizing chamber is provided with bellows in a gas field ionization ion source. But, the ionizing chamber is in contact with room temperature through a vacuum sample chamber wall, and it is not indicated that the gas supplied into the ionizing chamber has a problem of striking the high-temperature vacuum sample chamber wall. And, it is not described either that the emitter tip is tilted.

Japanese Patent Application Laid-Open No. S62-114226 (PATENT LITERATURE 3) discloses a direction regulating mechanism in a gas field ionization ion source that enables to change the axial direction of the ion source. But, an ionizing chamber is in contact with room temperature through a vacuum sample chamber wall, and it is not suggested that the gas supplied into the ionizing chamber has a problem that it strikes the high-temperature vacuum sample chamber wall. And, an extraction electrode tilts with a change in the axial direction of the ion source.

Japanese Patent Application Laid-Open No. H01-221847 (PATENT LITERATURE 4) discloses a selector switch to connect a high voltage introduction line for an extraction electrode to a high voltage introduction line for an emitter tip, and also discloses a gas field ionization ion source capable of preventing an electric discharge between the emitter tip and the extraction electrode after a forced electric discharge treatment between an ion source outer wall and the emitter tip, namely a so-called conditioning treatment.

Japanese Patent Application Laid-Open No. H08-203461 (PATENT LITERATURE 5) discloses a structure of a charged beam apparatus that a vibration preventing tool is provided between an apparatus stand and a base plate on which a charged particle apparatus main body is mounted. But, there is no description about a cooling mechanism of a charged particle source.

The sample can also be minutely processed by emitting the ion beam to the sample. This processing applies an action that the particles constituting the sample are emitted from the sample by an ion sputtering operation. For this processing, a focused ion beam (hereinafter called as FIB) using a liquid metal ion source (hereinafter called as LMIS) is suitable. And, an FIB-SEM apparatus, which is a composite machine of the SEM and the focused ion beam, is also used in recent years. This FIB-SEM apparatus can perform SEM observation of a cross section of a square hole formed at a desired position by emitting the FIB.

For example, Japanese Patent Application Laid-Open No. 2002-150990 (PATENT LITERATURE 6) discloses a device for observing a defect, a foreign matter or the like and analyzing by forming an angle hole near an abnormal portion of a sample by the FIB, and observing a cross section of the angle hole by the SEM device.

PCT International Publication WO99/05506 (PATENT LITERATURE 7) discloses a technology that an FIB and a probe are used to take a minute sample from a bulk sample so to observe through a transmission electron microscope.

Japanese Patent Application Laid-Open No. H09-312210 (PATENT LITERATURE 8) discloses a cooling technology that a to-be-cooled body of a super-conductive magnet and a refrigerator are separated from each other, and they are thermally connected by means of a detachable vacuum insulated pipe. But, it does not disclose a structure to prevent the operation vibration of the refrigerator when they are mounted and the cooling operation is performed.

Japanese Patent Application Laid-Open No. H04-230880 (PATENT LITERATURE 9) discloses a structure that a high frequency receiving coil for NMR is determined as a to-be-cooled body, and the to-be-cooled body is thermally connected to a cooling stage, which is cooled with a refrigerant, in a vacuum space. But, it does not disclose a structure that the vacuum space having the to-be-cooled body therein and the vacuum space having the cooling stage are hermetically isolated by a bulkhead from each other.

CITATION LIST

Patent Literatures

PATENT LITERATURE 1: Japanese Patent Application Laid-Open No. S58-85242
PATENT LITERATURE 2: Japanese Patent Application Laid-Open No. H03-74454
PATENT LITERATURE 3: Japanese Patent Application Laid-Open No. S62-114226
PATENT LITERATURE 4: Japanese Patent Application Laid-Open No. H01-221847
PATENT LITERATURE 5: Japanese Patent Application Laid-Open No. H08-203461
PATENT LITERATURE 6: Japanese Patent Application Laid-Open No. 2002-150990
PATENT LITERATURE 7: PCT International Publication WO99/05506
PATENT LITERATURE 8: Japanese Patent Application Laid-Open No. H09-312210
PATENT LITERATURE 9: Japanese Patent Application Laid-Open No. H04-230880

Non Patent Literature

NON PATENT LITERATURE 1: H.-S. Kuo, I.-S. Hwang, T.-Y. Fu, J.-Y. Wu, C.-C. Chang, and T. T. Tsong, Nano Letters 4 (2004) 2379
NON PATENT LITERATURE 2: J. Morgan, J. Notte, R. Hill, and B. Ward, Microscopy Today, Jul. 14 (2006) 24

SUMMARY OF INVENTION

Technical Problem

The present inventors have made a devoted study to provide a large current and high stability to an ion microscope using a gas field ionization ion source, and they have obtained the following knowledge.

The ion microscope using the field ionization ion source can observe the sample at a high signal/noise ratio if an ion beam having a large current density can be obtained on the sample. To obtain a larger current density on the sample, it is better that an ion radiation angle current density of the field ionization ion source is larger. To increase the ion radiation angle current density, it is desired that the emitter tip is cooled to a very low temperature and an ion material gas pressure around the emitter tip is increased to about $10^{-2}$ to 10 Pa.

But, when the ion material gas pressure is raised to 1 Pa or more, the ion beam striking the neutral gas becomes neutral, and the ion current decreases. And, when the number of gas molecules within the field ionization ion source increases, the gas molecules striking the vacuum container wall having a temperature higher than the emitter tip come to have a high temperature and strike the emitter tip, and the emitter tip temperature is increased to cause a problem that the ion current decreases.

Therefore, it is considered to dispose a structure to mechanically surround the periphery of the emitter tip, namely a gas ionizing chamber having an ion extraction electrode or the like as a wall, so as to supply gas molecules of a very low temperature to only the periphery of the emitter tip. In this case, the gas ionizing chamber and the emitter tip have a stationary structure.

But, an emitter tip having a nanopyramid structure with a minute projection formed at the tip end has an ion beam emitting angle of only about one degree. Therefore, it is necessary to direct the ion beam toward the sample. At this time, when the direction of the emitter tip is mechanically adjusted to tilt the emitter tip, the direction of the extraction electrode is also tilted because the gas ionizing chamber has a stationary structure. A slight tilt of this extraction electrode influences the focusing performance of the ion beam. That is, the present inventors have found a problem that the resolution of sample observation is deteriorated.

An ion microscope provided with a gas field ionization ion source often includes an emitter tip cooling means such as a mechanical refrigerator which generates mechanical vibration, and the emitter tip tends to vibrate. When the emitter tip vibrates, the ion beam vibrates, causing a problem that the resolution of sample observation is deteriorated. A first subject of the present invention is to provide an ion microscope enabling to perform high resolution sample observation by reducing the mechanical vibration of the emitter tip.

When it is necessary to direct the ion beam toward the sample, the emitter tip is tilted by mechanically adjusting the emitter tip direction, but the present inventors have found a problem that when the gas ionizing chamber is determined to have a movable structure, the cooling mechanism is mechanically connected to the gas ionizing chamber, and when the cooling mechanism is a heavy load, it is difficult to mechanically adjust the emitter tip direction, and the sample observation resolution is deteriorated. A second subject of the invention is to enable to adjust the emitter tip direction easily and to achieve both the improvement of ion source brightness by low vibration cooling of the emitter tip and the improvement of focusing performance of the ion beam by adjusting the emitter tip direction.

And, to have a large ion current for the gas field ionization ion source, it is important to increase the gas molecule density near the tip. The gas molecule density per unit pressure is inversely proportional to the gas temperature, and it is important to cool the gas as well as the emitter tip. But, the present inventors have found a problem that when the gas molecule ionizing chamber having the gas molecule therein is cooled by heat conduction from the cold head of the refrigerator which decreases a temperature most via a good heat conductor which is a cold finger, the temperature lowers if the cold finger is long, the gas molecule ionizing chamber and the emitter tip housed in the gas molecule ionizing chamber cannot be cooled to the very low temperature. A third subject of the invention is to decrease the gas molecule ionizing chamber and the emitter tip to a very low temperature.

In the gas field ionization ion source, impurity molecules in the apparatus accumulate at the emitter tip end when the operation continues, and a large ion current cannot be obtained. Therefore, to change to a new emitter tip periodically, the apparatus interior is raised to normal temperature and then opened to the atmosphere pressure. At this time, since the impurities in the atmosphere enter into the apparatus, the emitter tip and the apparatus interior including partly the cooling mechanism for cooling the emitter tip are required to be baked at a high temperature of about 300 degrees C. But, the present inventors have found that since a member inferior in heat resistance such as Mylar in the radiant heat reflective sheet for heat insulation is often used for the cooling mechanism, it is altered by heat at the time of baking, the thermal insulation performance is deteriorated, the cooling performance is lowered, and the emitter tip cannot be achieved to have a very low temperature. A fourth subject of the invention is to prevent the heat resistance of the cooling mechanism from being deteriorated while baking.

Time required to freeze the emitter tip to a very low temperature tends to become long as the cooling mechanism and the member to be cooled have a larger mass. And, as the refrigerator configuring a part of the cooling mechanism, a small and low-power refrigerator is often selected to reduce the operation vibration. Therefore, the present inventors have found a problem that it takes long time to cool the apparatus, time to start the apparatus becomes long, and the apparatus operation rate lowers. Then, a fifth subject of the invention is to reduce the emitter tip cooling time.

An object of the invention relates to provision of a gas field ionization ion source that large current can be obtained and it is highly stable, and an ion microscope having high resolution and a large focal depth.

Another object of the invention relates to provision of an apparatus that a sample is fabricated with an ion beam to form a cross section and the cross section is observed with an ion microscope, and a cross section observing method.

And, another object of the invention relates to provision of an analyzer and an inspection device which can be used alone to observe a sample with an ion microscope, to observe a sample with an electron microscope and to perform elemental analysis, and to observe and analyze a defect, a foreign substance, etc.

Solution to Problem

The present invention relates to an ion microscope provided with a gas field ionization ion source, wherein a refrigerant circulation circuit cooling mechanism is disposed so that a refrigerator for cooling the gas field ionization ion source is disposed independent of the ion microscope main body and a refrigerant is circulated between the gas field ionization ion source and the refrigerator. The above-described first to fifth subjects found by the present inventors and the objects of the invention are independent of one another. Therefore, the invention described in one claim does not necessarily solve all the above subjects and objects. And, the present specification also discloses a technical idea that solves only a part of the above subjects and objects.

Advantageous Effects of Invention

The mechanical vibration of the refrigerator, which propagates to the gas field ionization ion source can be reduced by the present invention, and both the improvement of the brightness of the ion source and the improvement of ion beam focusing performance can be achieved.

DESCRIPTION OF EMBODIMENTS

Figure 1:
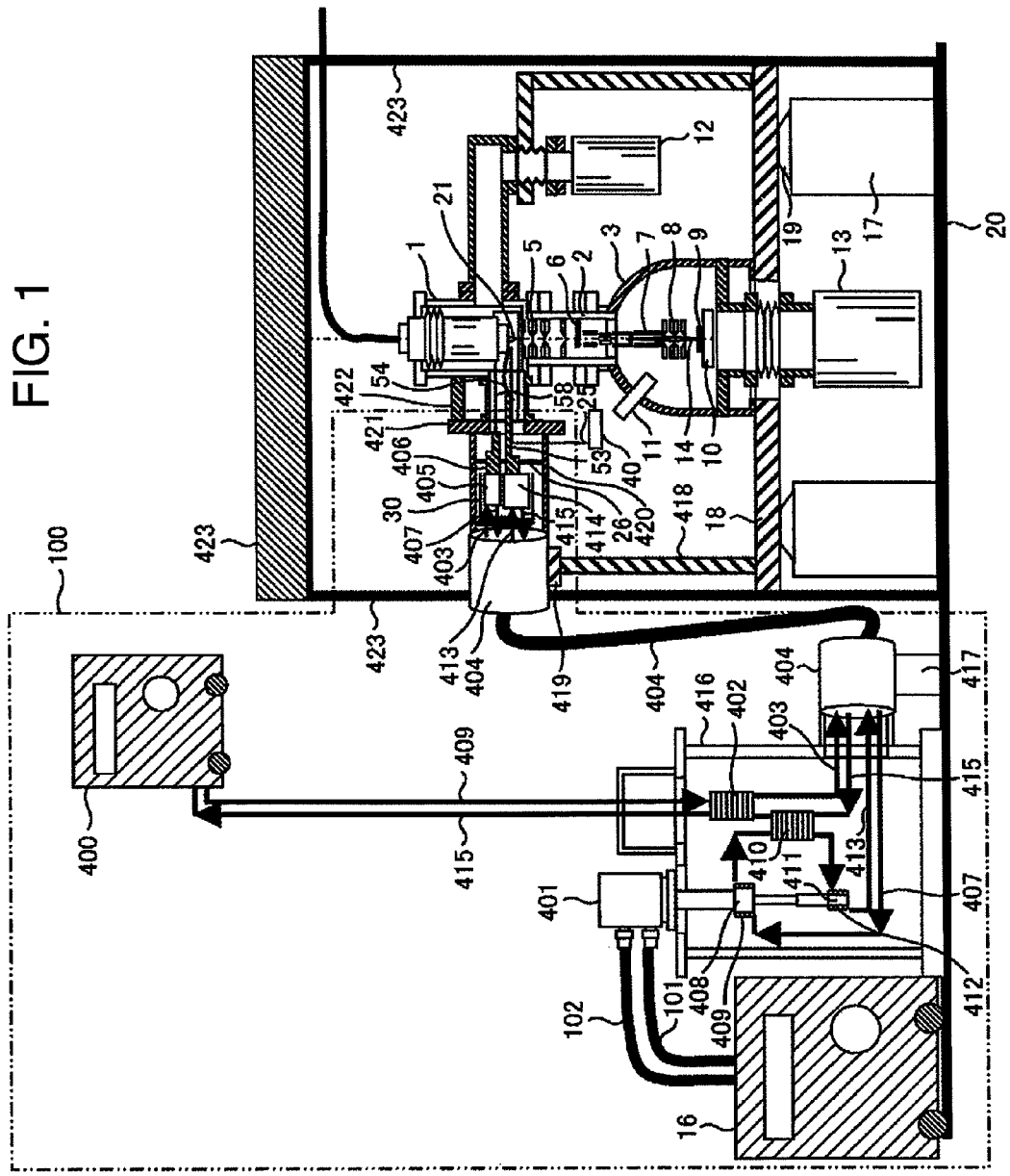
FIG. 1 is a schematic structure view of the ion microscope according to Embodiment 1.

An embodiment discloses an ion microscope, comprising a field ionization ion source which has an emitter tip having a needle-shaped end, an ionizing chamber in which the emitter tip is arranged, a pipe for supplying gas molecules to the vicinity of the end of the emitter tip, and an extraction electrode for generating an electric field to ionize the gas molecules in the vicinity of the emitter tip end; a sample stage on which a sample is placed; a lens for focusing an ion beam from the gas field ionization ion source onto the sample; a base for supporting the field ionization ion source, the sample stage and the lens; an apparatus stand; a vibration removal mechanism disposed between the base and the apparatus stand; a cooling heat conductor thermally connected partly to the field ionization ion source; a heat exchanger thermally coupled to the cooling heat conductor; a refrigerator independent of the base; a two-way pipe for circulating a refrigerant between the heat exchanger and the refrigerator; and a vacuum insulated pipe which houses at least part of the two-way pipe, wherein one end of the vacuum insulated pipe is supported by the base.

The embodiment also discloses the ion microscope comprising a first two-way pipe in which a very low temperature refrigerant for cooling the field ionization ion source flows; and a second two-way pipe which is disposed to thermally shield the first two-way pipe and in which a refrigerant having a temperature higher than that of the very low temperature refrigerant flows.

The embodiment also discloses the ion microscope, wherein the one end of the vacuum insulated pipe supported by the base is provided with a bulkhead through which the cooling heat conductor is disposed, the heat exchanger is arranged within the vacuum insulated pipe, and the heat exchanger is vacuum-isolated from the field ionization ion source. Preferably, the vacuum bulkhead has a honeycomb structure.

The embodiment also discloses the ion microscope further comprising a base mount for supporting the emitter tip and a deformable mechanism element for connecting the base mount and the extraction electrode, wherein the ionizing chamber is comprised of at least the base mount, the extraction electrode and the deformable mechanism element, and the ionizing chamber is movable.

The embodiment also discloses the ion microscope, wherein the vacuum insulated pipe is divided into at least two, one of the vacuum insulated pipes is supported by the base, the other is supported by the apparatus stand, and the divided vacuum insulated pipes are vacuum-connected with a bellows.

The embodiment also discloses the ion microscope wherein the vacuum insulated pipe is provided with a liquid nitrogen circuit to cool the inside of the vacuum insulated pipe. Preferably, the liquid nitrogen circuit and the two-way pipe are thermally integrated with each other within the vacuum insulation container.

The embodiment also discloses the ion microscope, wherein the one end of the vacuum insulated pipe supported by the base is provided with the bulkhead through which the two-way pipe is disposed, and the vacuum insulated pipe interior is vacuum-isolated from the field ionization ion source.

The embodiment also discloses the ion microscope, wherein an operation mode circulates a refrigerant in the two-way pipe when a vacuum container including the field ionization ion source, the sample stage and the lens is baked.

In the embodiment, a vibration preventing mechanism is disposed between a base plate on which an ion microscope main body is mounted and an apparatus stand, a cooling mechanism for cooling the gas field ionization ion source is suspended from a first support mechanism which is fixed to a floor on which the apparatus stand is disposed or to the base plate, and a cooling mechanism thermally integrated with a cooling member of the emitter tip is suspended from a second support mechanism which is rigidly fixed to the ion microscope main body to reduce mechanical vibration of the gas field ionization ion source, thereby enabling to perform high resolution sample observation.

In the embodiment, a vibration preventing mechanism is disposed between a base plate on which an ion microscope main body is mounted and an apparatus stand, a cooling mechanism for cooling the gas field ionization ion source is suspended from a first support mechanism which is fixed to a floor on which the apparatus stand is disposed or to the base plate, a cooling mechanism thermally integrated with a cooling member of the emitter tip is suspended from a second support mechanism which is rigidly fixed to the ion microscope main body, a vibration preventing mechanism is disposed between the fixing portions of the both cooling mechanisms, and the second support mechanism which is rigidly fixed to the ion microscope main body and the mass of the cooling mechanism which is supported by the second support mechanism are reduced, thereby achieving both the improvement of ion source brightness by low vibration cooling of the emitter tip and the improvement of focusing performance of an ion beam by adjustment of the direction of the emitter tip.

In the embodiment, there is disposed a mechanism for cooling the emitter tip and the gas molecule ionizing chamber to a very low temperature through the heat exchanger by leading a very low temperature cooling medium of the cooling mechanism for cooling the gas field ionization ion source to a gas molecule ionizing chamber having the emitter tip therein, thereby realizing the emitter tip with a very low temperature.

In the embodiment, the space between the cooling mechanism for cooling the gas field ionization ion source and a vacuum container having the emitter tip therein is hermetically isolated by a bulkhead, and there is disposed a mechanism for cooling by circulating a cooling refrigerant within the cooling mechanism when the vacuum container interior is baked, thereby preventing degradation of heat resistance of the cooling mechanism when baking.

In the embodiment, a second cooling mechanism which includes therein a circuit to supply and flow a liquefied refrigerant such as liquid nitrogen and supports cooling with its cooling heat is additionally disposed. It is combined with the cooling mechanism for cooling the gas field ionization ion source to carry out the cooling of the emitter tip in a short time.

According to this embodiment, there can be provided a gas field ionization ion source which has the reduction of mechanical vibration achieved and both the improvement of the brightness of the ion source and the improvement of ion beam focusing performance achieved, and an ion microscope capable of performing high-resolution observation.

According to this embodiment, there can be provided a gas field ionization ion source which has the emitter tip provided with a very low temperature and can obtain a large current ion beam, and an ion microscope capable of performing high-resolution observation.

According to this embodiment, there can be provided a gas field ionization ion source which has realized the weight reduction of the cooling mechanism, can adjust easily a direction of the ion source emitter tip with an emitter tip built therein, and improves the ion beam focusing performance by adjusting the emitter tip direction, and an ion microscope capable of performing high-resolution observation.

According to this embodiment, there can be provided a gas field ionization ion source having a cooling mechanism of which refrigeration performance is not deteriorated even after baking, and an ion microscope capable of performing high-resolution observation.

According to this embodiment, there can be provided a gas field ionization ion source that the apparatus operation rate is improved by reducing the apparatus cooling time, and an ion microscope capable of performing high-resolution observation.

The above and other novel features and effects of the present invention are described below with reference to the drawings. The drawings are mainly used for the understanding of the invention and do not restrict the scope of the invention. And, the individual embodiments can be combined suitably and their combinations are also disclosed in the specification.

Embodiment 1

FIG. 1 shows a schematic structure view of the ion microscope according to this embodiment. This apparatus is comprised of a gas field ionization ion source 1, an ion beam irradiation system column 2, a vacuum sample chamber 3 and the like. The gas field ionization ion source 1 is connected with an end portion 420 of a transfer tube 404 which is one of the component elements of a cooling mechanism 100.

The ion beam irradiation system column 2 houses therein an electrostatic type condenser lens 5, a beam limiting aperture 6, a beam scanning electrode 7, an electrostatic type objective lens 8 and the like. The vacuum sample chamber 3 houses therein a sample stage 10 for placing a sample 9 thereon, a secondary particle detector 11 and the like. The gas field ionization ion source 1 is provided with an ion source vacuum exhaust pump 12, and the vacuum sample chamber 3 is provided with a sample chamber vacuum exhaust pump 13. The ion beam irradiation system column 2 is kept to have a vacuum interior.

A floor 20 has thereon a compressor unit (compressor) 16 which has helium gas as a working gas. The compressor unit compressor unit 16 supplies a high-pressure helium gas to a Gifford-McMahon type (GM type) refrigerator 401 through a pipe 101 and a pipe 102. And, the high-pressure helium gas expands periodically within the GM type refrigerator to generate coldness, and a low-pressure helium gas resulting from the expansion to have a low pressure is recovered by the compressor unit through the pipe 101.

The helium gas which is working gas to become an operating refrigerant is cooled by the GM type refrigerator 401, a heat exchanger 410, a heat exchanger 412 and a heat exchanger 402. A compressor unit 400 circulates the helium gas. A 0.9 MPa normal-temperature helium gas (temperature of 300K) pressurized by the compressor unit 400 flows into the heat exchanger 402 through a heat exchanger 409, and is cooled to a temperature of about 60K by performing the heat exchange with a returning low-temperature helium gas to be described later. The cooled helium gas is transported through a pipe 403 within the heat-insulated transfer tube 404 and flown into a heat exchanger 405 disposed near the gas field ionization ion source 1.

Here, it cools a cooling conductor 406 which is thermally integrated with the heat exchanger 405 to a temperature of about 65K to cool a radiation shield 58 and the like. The warmed helium gas flows out of the heat exchanger 405, flows into the heat exchanger 409 which is thermally integrated with a first cooling stage 408 of the GM type refrigerator 401 through a pipe 407, is cooled to a temperature of about 50K, and flows into the heat exchanger 410.

Here, it is cooled to a temperature of about 15K by performing the heat exchange with a return low temperature helium gas to be described later, then flown into a heat exchanger 412, which is thermally integrated with a second cooling stage 411 of the GM type refrigerator 401, and cooled to a temperature of about 9K, transported through a pipe 413 within the transfer tube 404, and flown into a heat exchanger 414 arranged near the gas field ionization ion source Here, it cools a cooling conductor rod 53, which is a good heat conductor thermally connected to the heat exchanger 414, to a temperature of about 10K. The helium gas warmed by the heat exchanger 414 flows sequentially into the heat exchangers 410 and 402 through a pipe 415, performs the heat exchange with the above-described helium gas to have substantially normal temperature (temperature of 275K), and is recovered by the compressor unit 400 through the pipe 415.

Though not shown in the drawing, the above-described low temperature portion is housed in a vacuum insulation container 416 and adiabatically connected to the transfer tube 404. And, in the vacuum insulation container 416, though not shown in the drawing, heat penetration from a room temperature portion to the low temperature portion by radiation heat is prevented by a radiation shield plate or a laminated heat insulating material.

The transfer tube 404 is stationarily supported firmly by the floor 20 via a support 417. Though not shown in the drawing, the pipe 403, the pipe 407, the pipe 413 and the pipe 415 which are stationarily supported within the transfer tube 404 by a fiberglass filled plastic heat insulator, which is a heat insulating material having a low coefficient of thermal conductivity, are also stationarily supported by the floor 20.

In the vicinity of the gas field ionization ion source 1, the transfer tube 404 is supportedly fixed to a support 418 which is stationarily supported by a base plate 18. Similarly, though not shown in the drawing, the pipe 403, the pipe 407, the pipe 413 and the pipe 415 which are stationarily supported within the transfer tube 404 by a fiberglass filled plastic heat insulator, which is a heat insulating material having a low coefficient of thermal conductivity, are elastically supported by the support 418 via an elastic body 419 such as rubber.

A flange 421 at an end portion 420 of the transfer tube 404 is stationarily supported by a support 422 which is stationarily supported by a vacuum container wall of the gas field ionization ion source 1. The pipe 403, the pipe 407, the pipe 413, and the pipe 415 which are stationarily supported within the transfer tube 404 by the above supporting structure are stationarily supported by the vacuum container wall of the gas field ionization ion source 1, and it becomes possible to synchronize the vibration of the above pipe group with the vibration of the gas field ionization ion source 1.

Specifically, the cooling mechanism 100 is comprised of coldness generating means, which generates coldness by expanding the first high pressure gas generated by the compressor unit 16, and a cooling mechanism which is cooled by the coldness of the coldness generating means and cools a to-be-cooled body with a helium gas which is a second moving refrigerant being circulated by the compressor unit 400. The cooling conductor rod 53 is connected to an emitter tip 21 via a deformable copper mesh wire 54 and a sapphire base. Thus, vibration prevention and cooling of the emitter tip 21 are realized.

In this embodiment, the GM type refrigerator becomes a cause of vibrating the floor, but the gas field ionization ion source 1, the ion beam irradiation system column 2 and the vacuum sample chamber 3 are disposed isolated from the GM refrigerator. In addition, the pipe 403, the pipe 407, the pipe 413 and the pipe 415 connected to the heat exchanger 405 and the heat exchanger 414, which are disposed near the gas field ionization ion source 1, are stationarily supported firmly by the floor 20 and the base plate 18, which are substantially vibration free, so not to be vibrated, and they are vibration-isolated from the floor, thereby providing a system with an extremely little transmission of mechanical vibration. And, the base plate 18 is arranged on an apparatus stand 17, and the gas field ionization ion source 1, the ion beam irradiation system column 2 and the vacuum sample chamber 3 are fixed to the base plate 18. A vibration removal mechanism 19 is arranged between the apparatus stand 17 and the base plate 18, so that a high frequency vibration of the floor is not easily transmitted to the gas field ionization ion source 1, the ion beam irradiation system column 2 and the vacuum sample chamber 3. In other words, the mechanical vibration is reduced by the gas field ionization ion source of the embodiment, and a gas field ionization ion source and an ion microscope enabling high-resolution observation are realized.

Sound from the compressor unit 16 or the compressor unit 400 which sends helium gas to the GM type refrigerator 401 vibrates the gas field ionization ion source 1 to deteriorate its resolution occasionally. Therefore, this embodiment provides an apparatus cover 423 which spatially separates the compressor and the gas field ionization ion source 1 from each other. Thus, the sound of the compressor of the refrigerator is insulated, and the influence of the vibration is further reduced, thereby realizing the gas field ionization ion source and the ion microscope which can perform the high-resolution observation. This effect is common among the embodiments using the compressor.

The compressor unit 400 is used to circulate the second helium gas in this embodiment, but the same effect can also be obtained by communicating the pipe 101 and the pipe 102 of the compressor unit 16 with the heat exchanger 409 and the pipe 415 via a flow amount adjusting valve, partly supplying helium gas of the compressor unit 16 as the second helium gas into the heat exchanger 409, and recovering the helium gas into the compressor unit 16 through the pipe 415. Thus, the cooling mechanism 100 is configured.

Figure 2:
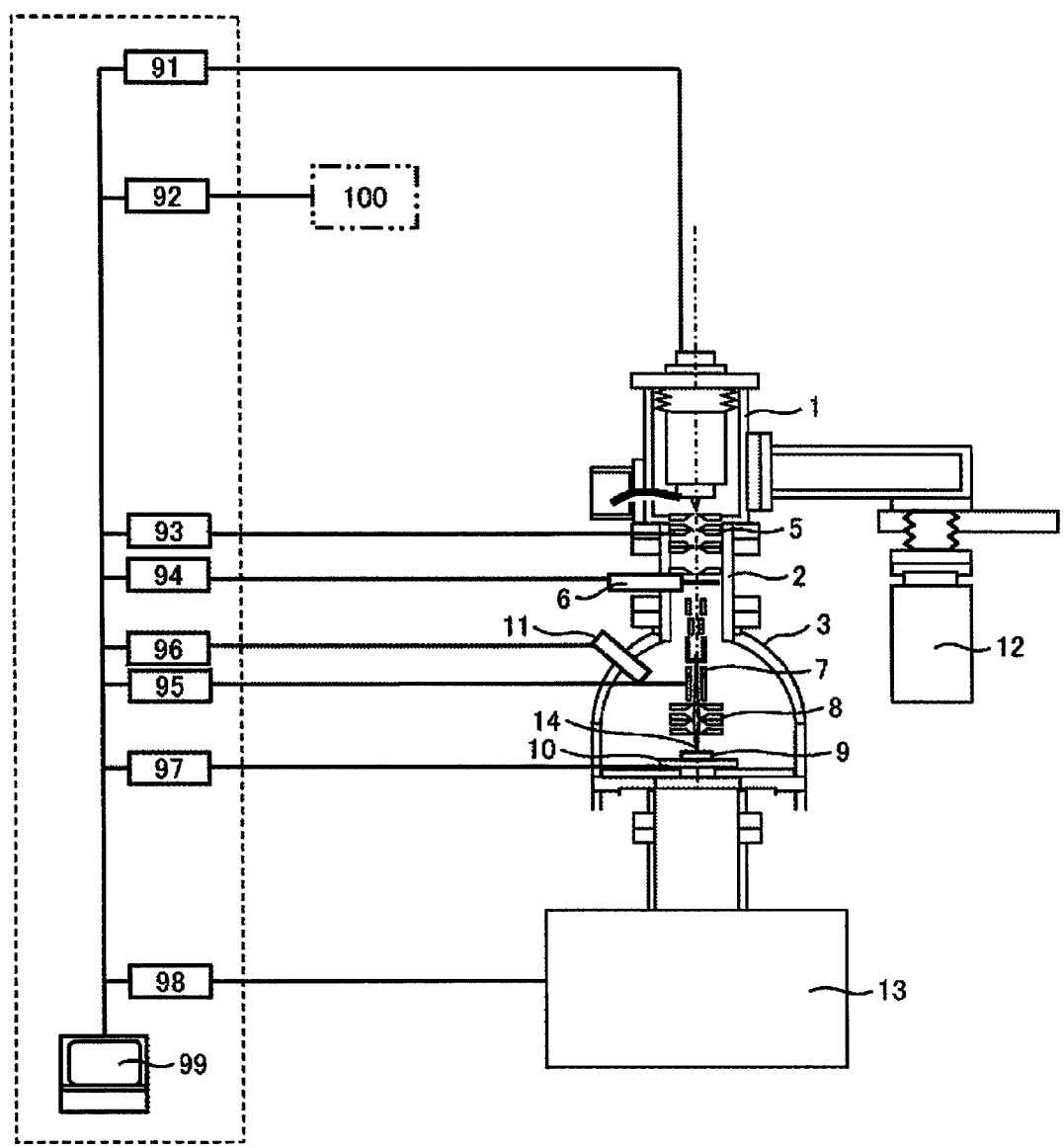
FIG. 2 is a schematic structure view of a device for controlling the ion microscope according to Embodiment 1.

FIG. 2 shows a device (or called as section) for controlling the ion microscope of this embodiment. This control device is comprised of a field ionization ion source control device 91, a cooling mechanism control device 92, a lens control device 93, a beam limiting aperture control device 94, an ion beam scan control device 95, a secondary electron detector control device 96, a sample stage control device 97, a vacuum exhaust pump control device 98, and an arithmetic processing unit 99 and the like. Here, the arithmetic processing unit 99 is provided with an image display portion for showing an image produced according to the detected signal of the secondary particle detector 11, information input by means of information input means, and the like. The sample stage 10 is provided with a linear movement mechanism for movement in two perpendicular directions on the sample mounting surface, a linear movement mechanism for movement in a direction perpendicular to the sample mounting surface, a rotation mechanism for rotation on the sample mounting surface, and a tilting function capable of varying an irradiating angle of the ion beam 14 to the sample 9 by rotating about a tilting axis, and they are controlled by the sample stage control device 97 according to a command sent from the arithmetic processing unit 99.

Figure 3:
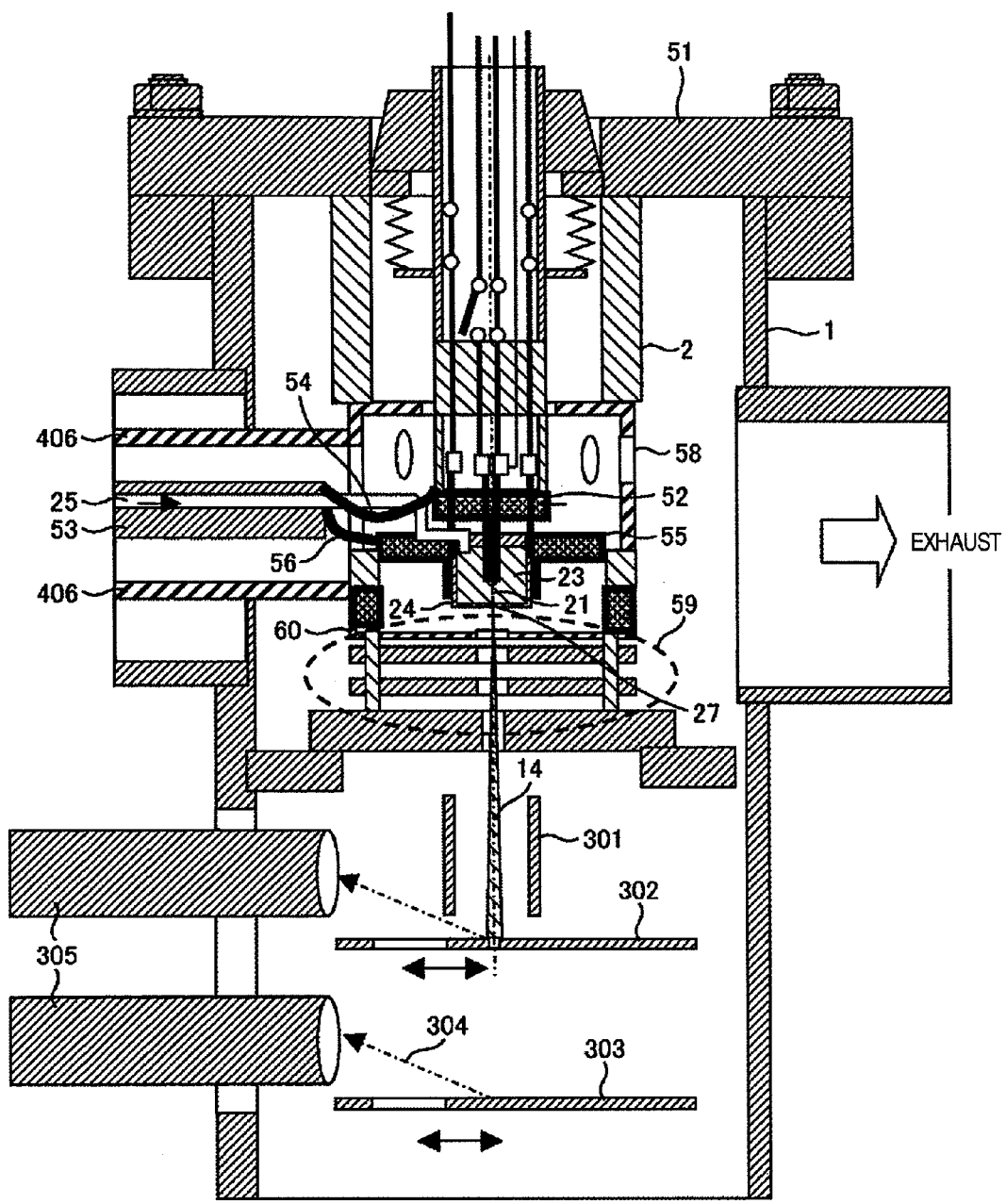
FIG. 3 is a schematic structure view of the field ionization ion source according to Embodiment 1.
Figure 4:
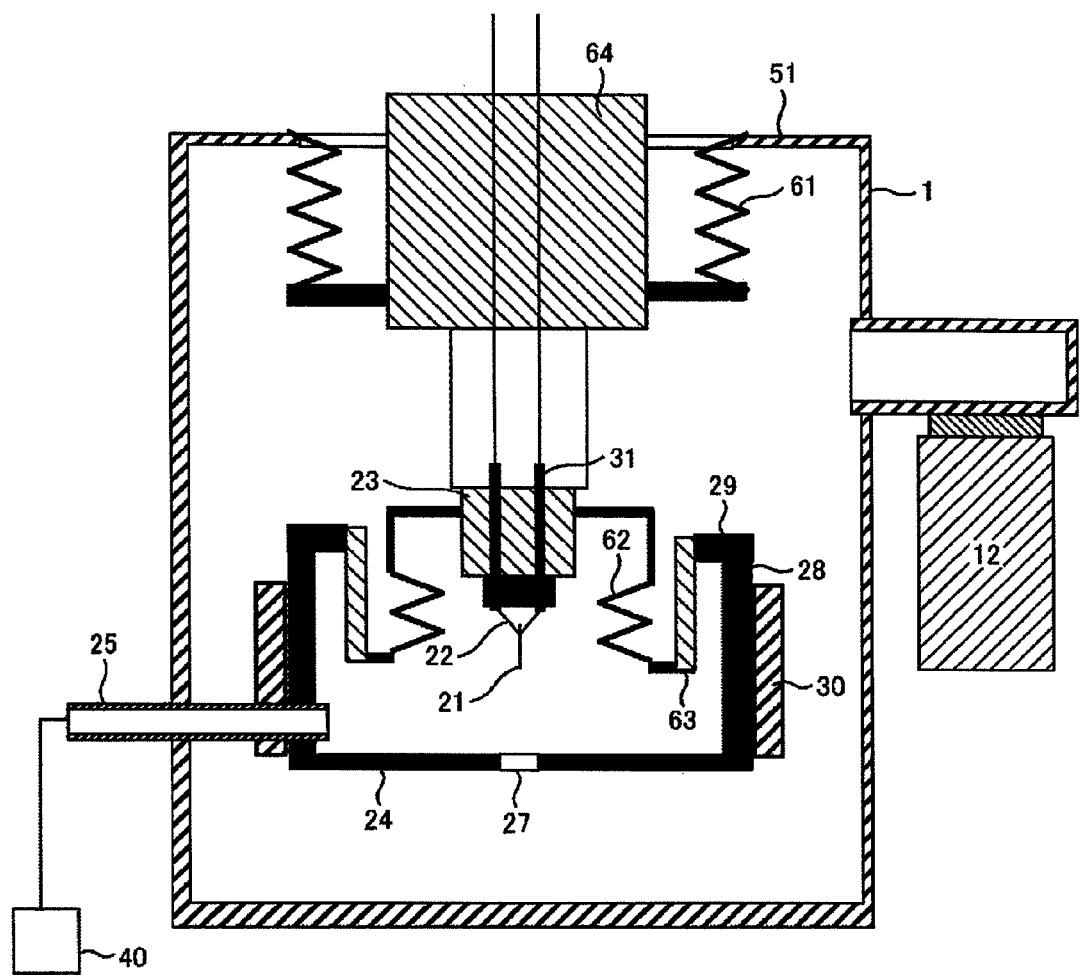
FIG. 4 is a schematic circumferential view of an emitter tip of the field ionization ion source according to Embodiment 1.

FIG. 3 shows a schematic structure view of the field ionization ion source according to this embodiment. And, FIG. 4 shows a schematic structure view of a field ionization ion source including a refrigerating mechanism for cooling the emitter tip and the like of the field ionization ion source of this embodiment. The field ionization ion source is configured of a vacuum container. The emitter tip 21 is configured to suspend from a vacuum container 51, so that the emitter tip 21 is adjustable in horizontally orthogonal two directions and in a vertical direction and has a movable structure that the angle of the emitter tip end can be adjusted. On the other hand, an extraction electrode 24 is stationary with respect to the vacuum container. And, a filament mount 23 is insulated by a sapphire base 52.

In this embodiment, the cooling conductor rod 53 and the sapphire base 52 are mutually connected by means of a deformable mechanism element such as the highly flexible copper mesh wire 54, thereby making the emitter tip 21 movable and decreasing transfer of high frequency vibration in comparison with a case of the connection by a rigid mechanism element. That is, the gas field ionization ion source using this cooling mechanism has a characteristic that the mechanical vibration of the emitter tip can be further reduced. And, the extraction electrode 24 has a stationary structure with respect to the vacuum container in view of decreasing the transfer of vibration from the refrigerator, but a sapphire base 55 supporting the extraction electrode and the leading end of the cooling conductor rod 53 of a good heat conductor are also connected by a deformable copper mesh wire 56. Thus, an ion microscope capable of performing a high-resolution observation is realized.

A radiation shield which is not shown is connected to the radiation shield 58 of FIG. 3 through the copper cooling conductor 406. This cooling conductor 406 is arranged near the emitter tip to cover the cooling conductor rod 53. The radiation shield 58 surrounds a gas molecule ionizing chamber including the emitter tip to reduce the inflow of heat due to heat radiation into the gas molecule ionizing chamber. In addition, the radiation shield 58 is present in a direction to draw out an ion beam from the gas molecule ionizing chamber and is connected to at least one of electrodes of the electrostatic lens 59 opposed to the gas molecule ionizing chamber. In the drawing, the electrostatic lens is configured of three electrodes, and an electrode 60 closest to the gas molecule ionizing chamber is connected to the radiation shield 58 and being cooled.

FIG. 4 shows a schematic circumferential view of the emitter tip of the field ionization ion source of this embodiment.

The circumference of the emitter tip of the field ionization ion source is comprised of the emitter tip 21, a filament 22, the filament mount 23, the extraction electrode 24, a gas supply pipe 25 and a deformable bellows B 62. The emitter tip 21 is fixed to the filament 22. The filament 22 has its both ends fixed to a support rod 31 of the filament mount.

The extraction electrode 24 is disposed opposite to the emitter tip 21 and has an aperture 27 through which an ion beam 14 is passed. A cylindrical side wall 28 and a top plate 29 are connected to the extraction electrode 24 to surround the emitter tip 21. A cylindrical laminated heat insulating material 30 is mounted on the periphery of the cylindrical side wall.

Here, a chamber surrounded by the extraction electrode, the side wall and the top plate is called as a gas molecule ionizing chamber. The gas supply pipe 25 is connected to the gas molecule ionizing chamber. An ionization gas such as helium gas or hydrogen gas is supplied through the gas supply pipe 25. This ionization gas is controlled to a prescribed flow amount by a flow amount adjusting device 40. Though not shown in the drawing, the gas supply pipe 25 is in contact with the cooling conductor 406 and then in thermal contact with the cooling conductor rod 53, cooled to the temperature of the cooling conductor rod 53 and lead into the gas molecule ionizing chamber.

The filament mount is fixed to an emitter base mount 64, and the emitter base mount 64 is fixed to the vacuum container 51 via a deformable bellows A 61.

Figure 5:
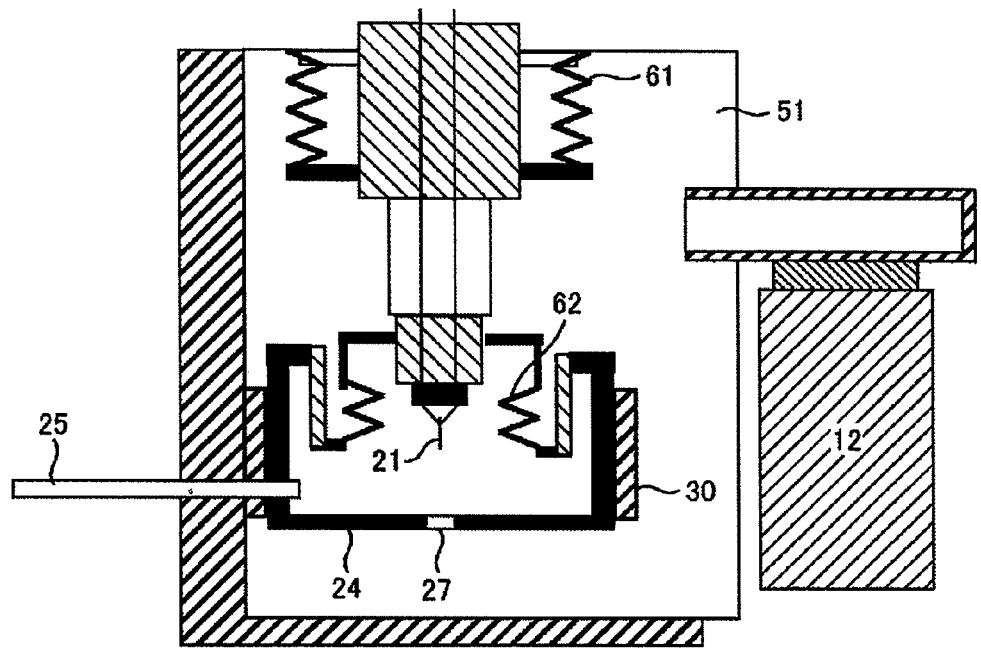
FIG. 5 is a schematic circumferential view of the emitter tip before tilting the emitter tip of the field ionization ion source according to Embodiment 1.
Figure 6:
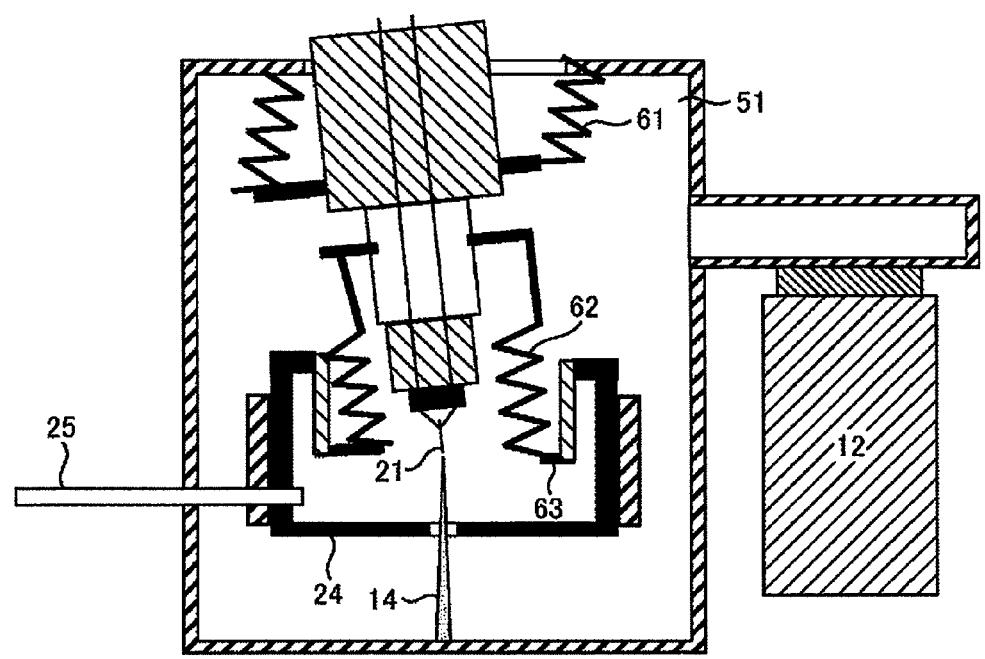
FIG. 6 is a schematic circumferential view of the emitter tip after tilting the emitter tip of the field ionization ion source according to Embodiment 1.

FIG. 5 and FIG. 6 show schematic circumferential views of the emitter tip and its periphery in the field ionization ion source before and after the emitter tip is tilted. It is seen that the bellows A 61 and the bellows B 62 are deformed to tilt the emitter tip. In this embodiment, a minimum diameter of the bellows B which is present between the emitter tip and the extraction electrode is smaller than a maximum diameter of the bellows A which is present between the emitter tip base mount and the vacuum container. Thus, an inverted triangle structure having the emitter tip end as a top is realized, and vibration of the emitter tip end is made smaller.

This inverted triangle structure has a characteristic that the emitter tip 21 is connected to the extraction electrode 24 through the deformable bellows B 62 and an insulating material 63. Thus, the emitter tip 21 is movable including tilting, the emitter tip periphery is surrounded by the extraction electrode 24 and the like, and helium does not leak except through an aperture 27 of the extraction electrode and the gas supply pipe 25. It is because the emitter tip 21 and the extraction electrode 24 are mutually connected with the deformable bellows B 62 between them, thereby contributing to enhancement of the airtightness of the gas molecule ionizing chamber.

Production of the emitter tip is described below. The emitter tip is a tungsten wire with a diameter of about 100 to 400 μm and in an axial direction <111>, its end is formed to be sharp, and the tip end has a curvature radius of several tens nm. In another vacuum container, iridium is vacuum-deposited on the emitter tip end. Then, platinum atoms are moved to the emitter tip end by heating at a high temperature, and a pyramid of a nanometer order is formed by the platinum atoms. It is determined to be called as nanopyramid. The nanopyramid tip end is one atom, and there is a layer of three or six atoms below it. In addition, there is a layer of 10 or more atoms below it.

The thin tungsten wire and the platinum were used in this embodiment, but a thin molybdenum wire can also be used. The platinum was coated in this embodiment, but iridium, rhenium, osmium, palladium, rhodium or the like can also be used. In a case where helium is used as an ionization gas, it is important that evaporation intensity of metal is larger than the electric field intensity when the helium is ionized, and platinum, rhenium, osmium, and iridium are suitable. When hydrogen is used, platinum, rhenium, osmium, palladium, rhodium, and iridium are suitable.

An operation of this ion source is described below. After the vacuum exhaustion in FIG. 4, the extraction electrode 24, the side wall 28 and the top plate 29 are heated to, for example, a temperature of 300 degrees C. by the laminated heat insulating material 30 which is on the outside of the gas molecule ionizing chamber side wall, thereby baking to degas. At the same time, the bellows A 61 is also heated by another resistance heater disposed in the atmosphere, so that a degree of vacuum of the bellows A 61 is improved, and concentration of residual gas decreases. By the above operation, the time stability of the ion emission current can be improved.

In this embodiment, the laminated heat insulating material 30 is disposed outside the gas molecule ionizing chamber. Therefore, there is no degassing from the resistance heater itself in comparison with the case that the laminated heat insulating material 30 is disposed inside, and the gas molecule ionizing chamber can be made higher vacuum.

As shown in FIG. 1, at the end portion 420 of the transfer tube 404, the spaces in contact with both sides of a vacuum bulkhead 26 are hermetically isolated by, for example, a stainless steel vacuum bulkhead 26 having heat resistance. When baking, the space on the ion source chamber side becomes the atmosphere and is kept at a baking temperature of 300 degrees C. In this state, the temperatures of the heat exchanger 405 and the heat exchanger 414 on the end portion 420 side rise through the cooling conductor rod 53 and the cooling conductor 406 opposed to the baking chamber. Since the components within the transfer tube 404 are assembled by a coupling means such as welding, silver soldering or the like, they are not influenced by baking. But, since the laminated heat insulating material 30 for preventing radiation heat disposed around the above component elements is configured of a material which has aluminum vapor-deposited on a thin polyester film, it is thermally decomposed at a baking temperature and cannot maintain thermal insulation performance. Therefore, the cooling operation is performed under control of the cooling mechanism control device 92 when baking to prevent the temperatures of the heat exchanger 405 and the heat exchanger 414 from increasing and to cool the temperature of the laminated heat insulating material to 120 degrees C. or below. Thus, the laminated heat insulating material 30 is prevented from being altered, and the gas molecule ionizing chamber can be cooled to a prescribed low temperature by the cooling operation after the baking.

Thus, heating of the gas molecule ionizing chamber and the vacuum container is stopped, and after a lapse of sufficient time, the cooling mechanism is operated to cool the emitter tip, the extraction electrode and the radiation shield. Then, the ionization gas such as helium or hydrogen is introduced into the gas molecule ionizing chamber through the gas supply pipe 25. Here, when it is determined that the extraction electrode has the aperture 27 having a diameter of 0.2 mm or less, it becomes possible to make the gas pressure of the gas molecule ionizing chamber larger than a degree of vacuum of the vacuum container on the outside of the ionizing chamber by at least one digit or more. Thus, a percentage that the ion beam strikes the gas in vacuum to neutralize decreases, and there is provided an effect that a sample can be irradiated with the large current ion beam. And, the number of the high-temperature helium gas molecules striking the extraction electrode decreases, and there are provided effects that the cooling temperatures of the emitter tip and the extraction electrode can be lowered, and the large current ion beam can be irradiated to the sample.

Subsequently, when a voltage is applied between the emitter tip 21 and the extraction electrode 24, an intense electric field is formed at the emitter tip end. A large amount of helium is attracted to the emitter tip surface by the intense electric field to reach the proximity of the emitter tip end where the electric field is most intense. Then, the helium is field ionized, and the ion beam is drawn out through an aperture of the extraction electrode. Here, when the electric field intensity is adjusted, a helium ion is generated near one atom at the nanopyramid top which is present at the emitter tip end. In other words, the ion is generated in a very limited region, so that a current released from a unit area and a unit solid angle can be increased. This is an important property to obtain a large current ion beam having a minute diameter on the sample.

In FIG. 3, the ion beam 14 having passed through the lens passes through a scanning deflection electrode 301 and a fine—diameter hole of an aperture plate 302 to strike a movable shutter 303. Here, a secondary particle 304 such as a secondary electron generated through the movable shutter is detected by a secondary particle detector 305 while scanning with the ion beam to obtain a secondary particle image, and an ion radiation pattern of the emitter tip can be observed. Accordingly, the emitter tip position and angle are adjusted while observing the ion radiation pattern. And, an ion beam path or an aperture position that the ion beam from one atom passes through the aperture can be selected and adjusted from the ion radiation pattern. When the pyramid tip end is formed of three or six atoms, an ion emitted from the vicinity of any one atom is selected to pass through the aperture, and the ion beam path or the aperture position can also be adjusted. The same effect can also be obtained by obtaining a secondary particle image by detecting a secondary particle such as a secondary electron or the like emitted from the aperture plate 302 by a secondary particle detector. Especially, when a fine projection is formed on the movable shutter to observe the secondary particle image, a clearer pattern can be observed. And, after the adjustment, the shutter 303 is moved to allow the passage of the ion beam.

In the field ionization ion source of this embodiment, the gas molecule ionizing chamber has high airtightness, the degree of vacuum is high on the outside of the gas molecule ionizing chamber, so that a percentage that the ion beam strikes the gas in vacuum and neutralized is small, and a large current ion beam can be irradiated to the sample. And, the number of the high-temperature helium gas molecules striking the extraction electrode decreases, the cooling temperatures of the emitter tip and the extraction electrode can be lowered, and the large current ion beam can be irradiated to the sample.

If the nanopyramid is damaged by an unexpected discharge phenomenon or the like, it is possible to reproduce the nanopyramid easily by heating (about 1000 degrees C.) the emitter tip for about 30 minutes, but if the damage cannot be repaired by the above treatment, a normal emitter tip is used instead of the damaged one.

An operation of the ion beam irradiation system is described below with reference to FIG. 1. The operation of the ion beam irradiation system is controlled by a command from the arithmetic processing unit 99. First, the ion beam 14 emitted from the emitter tip end of the ion source is focused on the sample 9 which is on the sample stage 10 by the objective lens 8 through the condenser lens 5 and the beam limiting aperture 6. Thus, a fine point-like beam can be obtained on the sample. In this case, the current is small to about several pA, but the beam diameter can be decreased to 1 nm or less. By scanning with this fine ion beam by the ion beam scanning electrode 7, the secondary electron or the like emitted from the sample is detected by the secondary particle detector 11, and its brightness is modulated. Thus, a scanning-ion-microscope image can be obtained on the image display means of the arithmetic processing unit 99. That is, high-resolution observation on the sample surface is realized.

The field ionization ion source of this embodiment has a characteristic that the ion emitted from the vicinity of one atom at the nanopyramid top end is used. That is, the region where the ion is emitted is small, and the ion light source is small to nanometer or less. Therefore, the characteristic of the ion source can be utilized to the maximum by focusing the ion light source on the sample with the same magnification or by increasing a reduction rate to about one-half. The size of the light source of a conventional gallium liquid metal ion source is presumed to be about 50 nm, and it is necessary that the reduction rate is determined to be one-tenth or less in order to realize a beam diameter of 5 nm or less on the sample. In this case, vibration of the emitter tip of the ion source is reduced to one-tenth or less on the sample. For example, even when the emitter tip vibrates 10 nm, it is 1 nm or less on the sample, and an influence on the beam diameter of 5 nm was negligible. But, in the ion source of this embodiment, vibration of 10 nm becomes vibration of 5 nm on the sample at the reduction rate of one-half, which becomes large with respect to the beam diameter. Therefore, it was not considered sufficiently for the conventional device, and good observation on the sample surface was not necessarily realized. In this embodiment, measures against the vibration are enough, so that the performance of the ion source is exerted enough, and the high-resolution observation of the sample surface is achieved.

The distance from an end of the objective lens 8 to the surface of the sample 9 is called as the working distance, and if it is decreased to less than 2 mm, ultrahigh resolution of less than 0.5 nm is realized. Conventionally, ions of gallium or the like were used, so that there was a concern that sputtered particles from the sample contaminate the objective lens to disturb the normal operation, but such a concern is little on the ion microscope of this embodiment, and ultrahigh resolution is achieved.

The extraction electrode of the field ionization ion source of this embodiment is fixed to the vacuum container, but the emitter tip becomes movable with respect to the extraction electrode because the emitter tip mount is connected through a copper mesh wire. Accordingly, the position adjustment of the emitter tip to the aperture of the extraction electrode and the axis adjustment to the optical system become possible, and a more minute beam can be formed.

When it is determined that the vacuum sample chamber and the sample chamber vacuum exhaust pump can be heated to about 200 degrees C. and the degree of vacuum of the sample chamber can be set to $10^{-7}$ Pa or less at most, contamination does not occur much when the ion beam is irradiated to the sample, and the sample surface can be observed well. In comparison with a conventional SEM, the growth of contamination deposition by irradiation of a helium or hydrogen ion beam was quick, and the observation of the sample surface was occasionally difficult. Therefore, when the vacuum sample chamber and the sample chamber vacuum exhaust pump are heated in a vacuum state, hydrocarbon-based residual gas in the vacuum sample chamber can be reduced, and the top surface of the sample can be observed with high resolution. Here, as the sample chamber vacuum exhaust pump, a turbo-molecular pump, a sublimation pump, a non-evaporative getter pump, an ion pump or a noble pump can be used. Especially, when any of the sublimation pump, the non-evaporative getter pump, the ion pump, the noble pump and an excel pump is used as a main vacuum pump, an ultrahigh vacuum of $10^{-7}$ Pa or less can be obtained relatively easily, and the top surface of the sample can be observed with high resolution without being largely influenced by the mechanical vibration. At the same time, even if the turbo-molecular pump is operating, the same effect can be obtained when the main vacuum pump is one of the sublimation pump, the non-evaporative getter pump, the ion pump, the noble pump and the excel pump. The same effect can also be exerted even if the legs of the apparatus stand 17 are provided with a vibration preventing mechanism.

According to this embodiment, the floor is caused to vibrate by the GM type refrigerator of the cooling mechanism, but the gas field ionization ion source 1, the ion beam irradiation system column 2 and the vacuum sample chamber 3 are disposed isolated from the GM refrigerator. In addition, the pipe 403, the pipe 407, the pipe 413 and the pipe 415 are vibration free because they are connected to the heat exchanger 405 and the heat exchanger 414, which are disposed in the vicinity of the gas field ionization ion source 1 at a leading end of the transfer tube, and stationarily supported firmly by the floor 20 and the base plate 18 which do not vibrate substantially. And, since they are vibration-isolated from the floor, transmission of mechanical vibration is extremely little. In addition, since the pipes and the heat exchangers are stationarily supported by the vacuum bulkhead of the gas field ionization ion source 1, relative vibration with the gas field ionization ion source 1 is eliminated, and reduction of mechanical vibration is realized.

In this embodiment, the vacuum bulkhead 26 is disposed, the cooling operation of the cooling mechanism 100 is performed under control by the cooling mechanism control device 92 when baking, and the laminated heat insulating material is cooled to a temperature of 120 degrees C. or below, so that the gas molecule ionizing chamber can be cooled to a prescribed low temperature by the cooling operation after the baking. In this embodiment, the vacuum bulkhead 26 has a honeycomb structure so as to provide a long heat transfer distance to thereby prevent penetration of heat from room temperature.

In this embodiment, the GM type refrigerator is used for the cooling mechanism, but the same effect is also exerted by using as the refrigerator, a pulse tube refrigerator, a Stirling type refrigerator, an electronic refrigerator or an expansion turbine type refrigerator.

Embodiment 2

Figure 7:
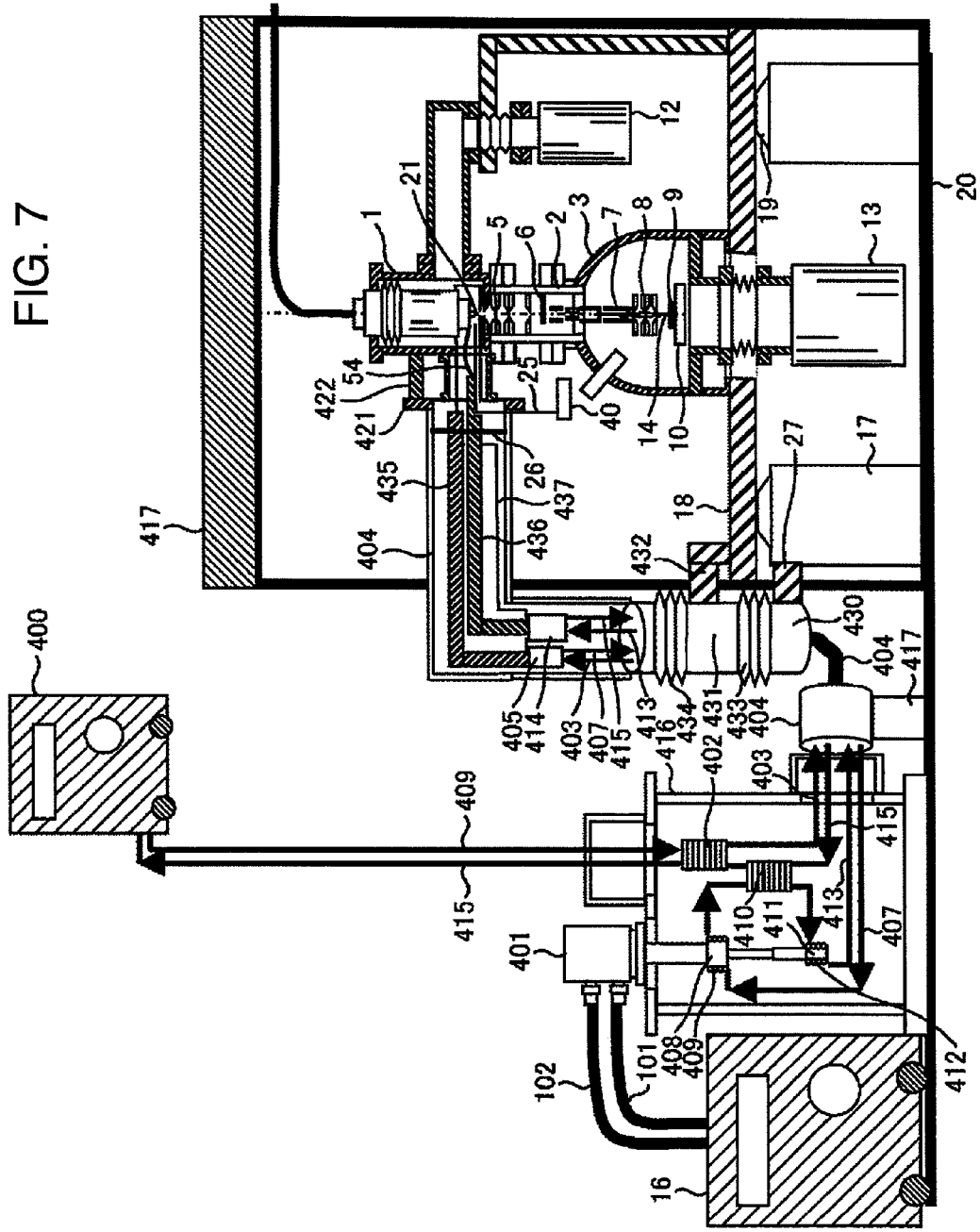
FIG. 7 is a schematic structure view of the ion microscope according to Embodiment 2.

FIG. 7 shows a schematic structure view of the ion microscope of this embodiment. Differences from Embodiment 1 are mainly described below.

In this embodiment, to reduce the weight of the transfer tube 404 which is stationarily supported by the gas field ionization ion source 1 and of which load is born by the gas field ionization ion source 1, the transfer tube 404 whose weight is generally large is raised substantially in a vertical direction from vertically below, and a transfer tube portion 430 positioned in widway is stationarily supported by an aperture 27, which is stationarily supported by the apparatus stand 17 directly connected to the floor 20, to support most of the weight of the transfer tube. A transfer tube portion 431 at a leading end portion of the transfer tube portion 430 is stationarily supported by a support 432 stationarily supported by the base plate 18 which has the vibration coming from the floor 20 removed by the vibration removal mechanism 19. Vacuum insulation spaces are connected by a vibration preventing bellows 433. In addition, a vibration preventing bellows 434 is disposed at a leading end portion of the vibration preventing bellows 433 to have a structure that the vacuum insulation spaces are connected. A cooling heat conductor 435 and a cooling heat conductor 436 have their end portions thermally integrated with the heat exchanger 405 and the heat exchanger 414, and other ends are airtightly passed through the vacuum bulkhead 26 to cool the heat shield plate 58 and the gas ion chamber. A radiation shield plate 437 is disposed around the cooling heat conductor 436 to be cooled to a very low temperature to prevent penetration of radiation heat from the room temperature of the transfer tube 404. The radiation shield plate 437 is thermally integrated with the low temperature cooling heat conductor 435. Material for most portions of the above members excepting the portions airtightly passed through the vacuum bulkhead 26 is aluminum in order for weight reduction. The distance between the support 417 and the aperture 27 is generally several meters, and the transfer tube 404 of which outer pipe facing the atmosphere is made of stainless steel has a gross weight of several tens of kilograms. In this embodiment, the distance between the support 432 and the support 422 is about 0.5 meter, and the weight of the transfer tube applied to the both supports becomes several kilograms, thereby achieving weight reduction.

According to this embodiment, it is realized to reduce the weight of the cooling mechanism stationarily supported by the gas field ionization ion source 1 which has the emitter tip built within it, and an angle can be changed freely from the transfer tube portion 431 stationarily supported by the support 432 by means of the bellows 434. Therefore, there can be provided a gas field ionization ion source that its ion beam focusing performance is improved by adjusting the direction of the emitter tip, and an ion microscope capable of performing high-resolution observation.

Embodiment 3

Figure 8:
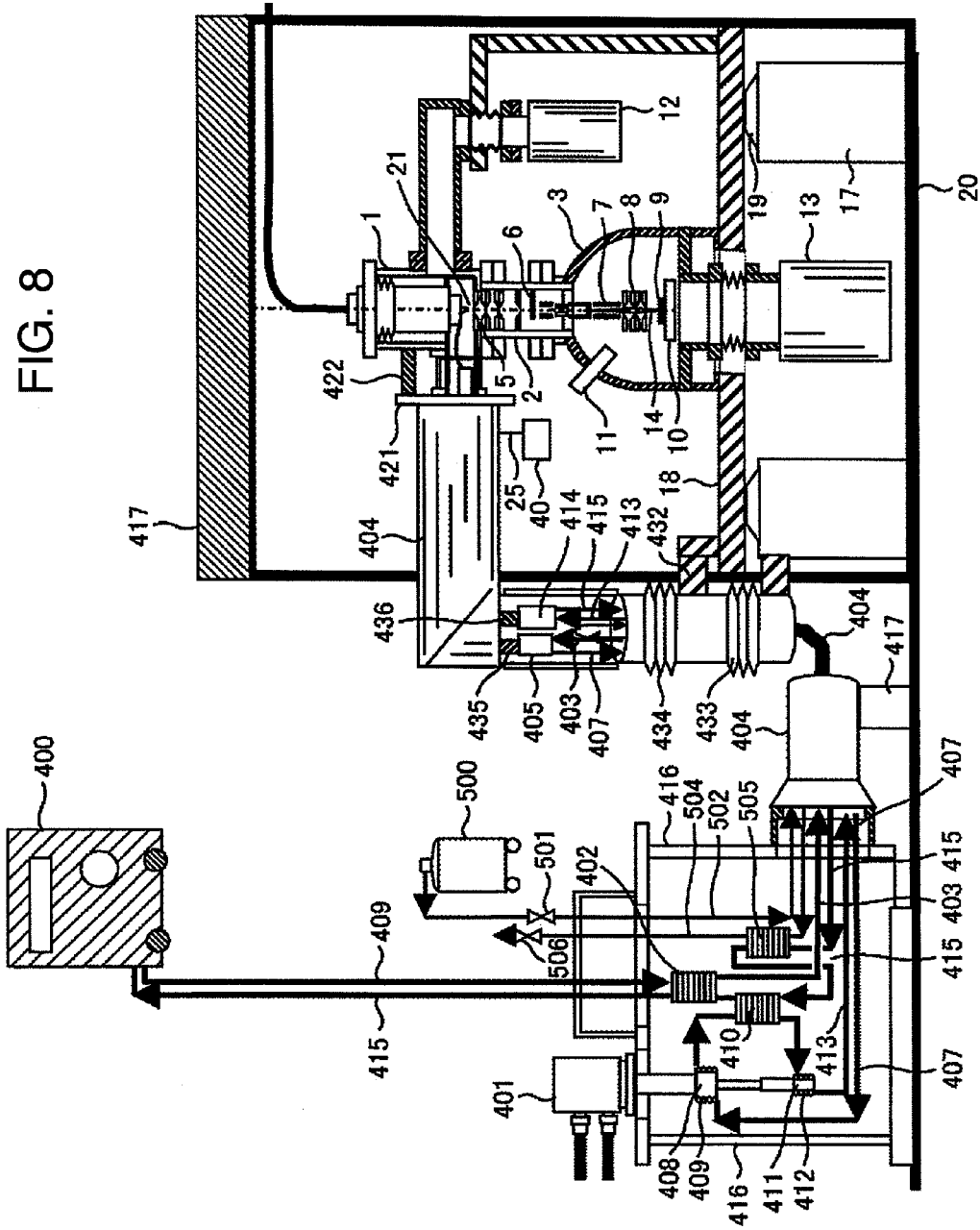
FIG. 8 is a schematic structure view of the ion microscope according to Embodiment 3.

In this embodiment, a structure that the emitter tip in a normal temperature state can be cooled in a short time is described below. Differences from Embodiments 1 and 2 are mainly described with reference to FIG. 8 and FIG. 9.

Liquid nitrogen which is a liquefied refrigerant in a liquid nitrogen container 500 is supplied to a pipe 502 via a valve 501. And, it flows through the pipe 403 which is thermally integrated with a radiation shield pipe 503 having a temperature of 80K arranged within the heat-insulated vacuum space of the transfer tube 404, and the pipe 502 which is at least partly connected thermally with a solder 507 or the like. Here, the helium gas as the working gas flowing through the body and inside of the pipe 403 is cooled to thereby cool the radiation shield pipe 503 having a large heat capacity. A leading end of the pipe 502 is U-turned at a leading end of the transfer tube 404, and the nitrogen is flown through a communicated pipe 504, returned into the vacuum container 416, flown into a heat exchanger 505 to perform heat exchange, and discharged to the atmosphere via a valve 506. In the heat exchanger 505, a mixed flow of a low-temperature liquid nitrogen and an evaporated gas nitrogen flows to cool a return helium gas flowing through the pipe 415, thereby performing quick initial cooling of the heat exchanger 410 and the heat exchanger 402, which have a large heat capacity in an initial state of cooling, to a liquid nitrogen temperature of −186 degrees C. Thus, initial cooling of the transfer tube 404, the heat exchanger 410 and the heat exchanger 402 is performed, and initial cooling of the helium gas within the pipe 403 and the pipe 413 is also performed at the same time. Thus, the heat exchanger 405 and the heat exchanger 414 are also undergone the initial cooling to the liquid nitrogen temperature in a short time, and the cooling conductor 435 and the cooling conductor 436 are also undergone the initial cooling to the liquid nitrogen temperature in a short time, so that the emitter tip can be cooled in a short time. Here, a space 508 and a space 509 within the transfer tube 404 are vacuum insulation spaces.

When the initial cooling is completed, the supply of the liquid nitrogen from the liquid nitrogen container 500 is stopped, the valve 501 is closed, and the valve 506 is closed after the liquid nitrogen in the pipe 502 is eliminated. When the cooling temperature is further lowered by the GM type refrigerator 401, the helium gas temperature of the pipe 415 becomes a very low temperature of about 5K, the heat exchanger 505 is cooled, the residual nitrogen gas in the above-described liquid nitrogen circuit coagulates, the circuit interior becomes vacuum, and heat penetration from the room temperature portion by convection and conduction of the gas is eliminated. Thus, thermal insulation can be made.

Figure 9:
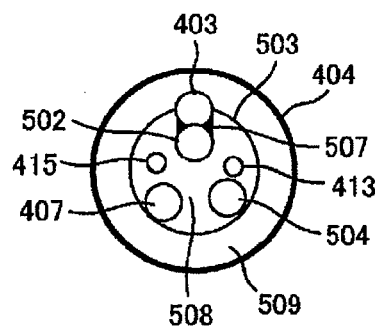
FIG. 9 is a sectional view of the transfer tube according to Embodiment 3.
Figure 10:
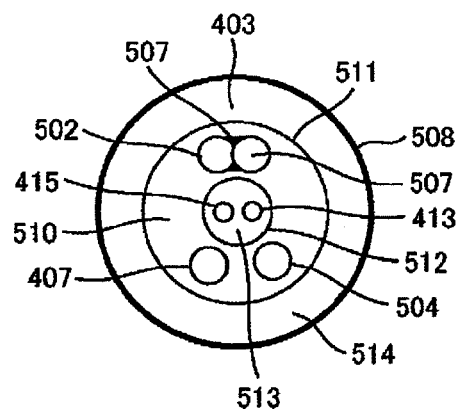
FIG. 10 is a sectional view of another transfer tube example.

FIG. 10 shows an embodiment of another transfer tube 508. FIG. 10 is different from the structure of FIG. 9 on the points that the heat shield pipe 503 of FIG. 9 is configured of a heat shield pipe 511 and a heat shield pipe 512 which configure a space 510 in which helium gas or hydrogen gas is sealed as a heat conducting medium in FIG. 10, and the space 510 has therein a pipe 502, a pipe 507, a pipe 407 and a pipe 504. Here, the heat exchange between the pipe 502 and the pipe 507 is performed between the pipes within the vacuum insulation container, so that it is not necessary to provide a dedicated heat exchanger, the space can be reduced, and the cost can also be reduced because the dedicated heat exchanger is not required. The heat shield pipe 511 and the heat shield pipe 512 are cooled by the liquid nitrogen or low temperature helium gas in the pipe via the sealed heat conducting medium such as helium gas or hydrogen gas. The pipe 413 and the pipe 415 are arranged within a vacuum insulation space 513. And, a space 514 is a vacuum insulation space.

According to this embodiment, there is provided the second cooling mechanism which has the circuit for circulating liquid nitrogen therein and supports cooling by its cooling heat, so that the emitter tip cooling time can be made short without increasing the refrigeration ability of the refrigerator, and the apparatus operation rate can be improved.

Embodiment 4

Figure 11:
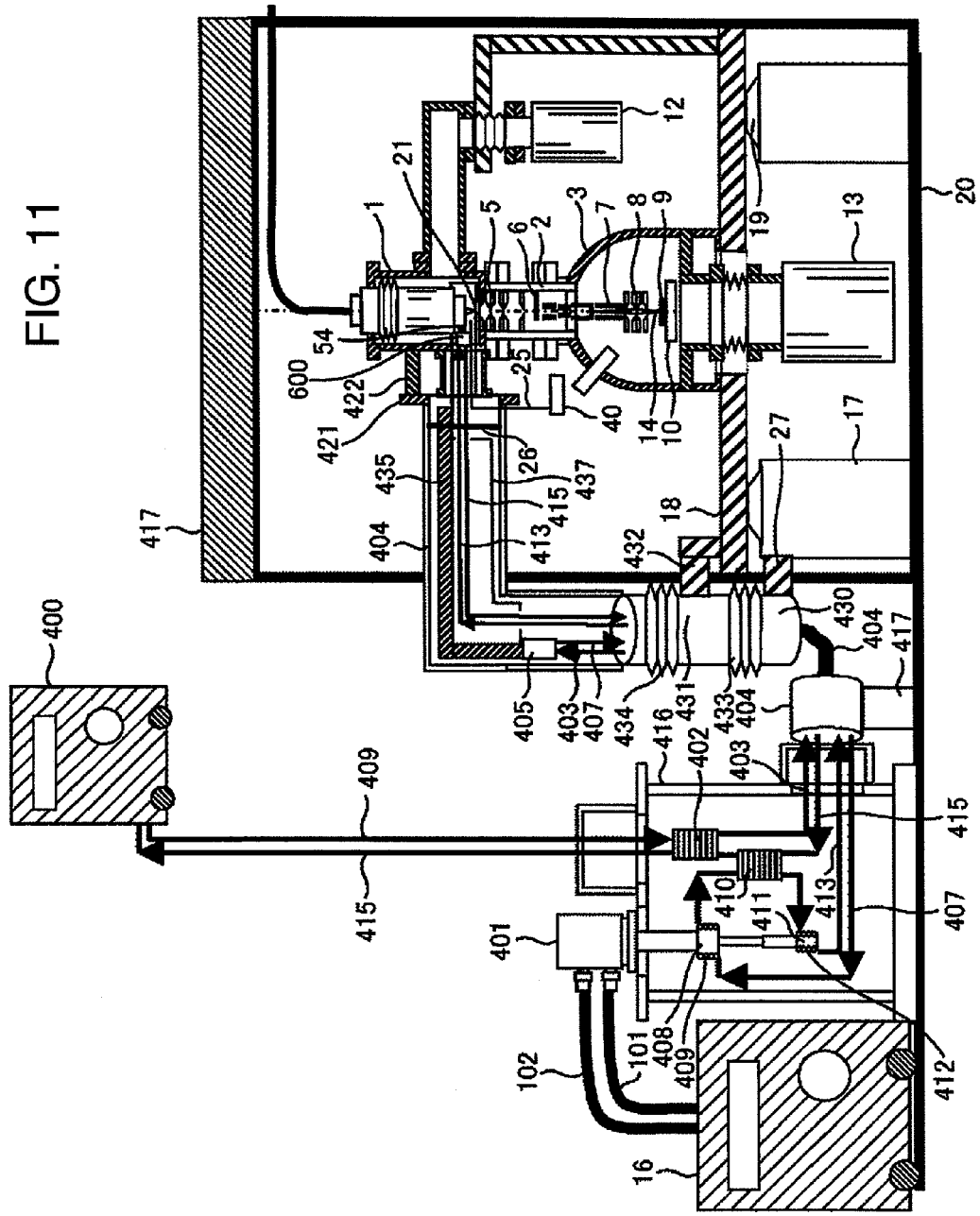
FIG. 11 is a schematic structure view of the ion microscope according to Embodiment 4.

Differences from Embodiments 1 to 3 are mainly described below with reference to FIG. 11.

In this embodiment, helium gas in the pipe 413 and the pipe 415 arranged to pass through the vacuum bulkhead 26 is lead to a heat exchanger 600, and the heat exchanger 600 is cooled to a very low temperature. The heat exchanger 600 is connected to the emitter tip 21 through the deformable copper mesh wire 54 and the sapphire base. Thus, cooling of the emitter tip 21 is achieved.

In this embodiment, the heat exchanger 600 near the emitter tip 21 can be cooled with the helium gas in the pipe 413, so that a temperature rise portion by the thermal resistance of the cooling heat conductor 436 is eliminated in comparison with the case of cooling the emitter tip 21 via the cooling heat conductor 436 of FIG. 7, and the emitter tip 21 can be cooled further to a low temperature.

When the helium gas is flown near the gas field ionization ion source 1 by the pipe 413 and the pipe 415 which are disposed to pass through the vacuum bulkhead 26, vibration is caused by the flow of the helium gas, which induces a risk of causing vibration of the emitter tip 21. But, a temperature of the helium gas in the pipe 413 and the pipe 415 is in a very low temperature state of about 5K, and the gas flow velocity in the pipes is sufficiently lowered, so that kinetic energy of a flow amount proportional to the square of the flow velocity is small, vibration due to the flow does not occur, and a problem is not caused.

According to this embodiment, the gas field ionization ion source 1 can be cooled to a lower temperature.

Industrial Applicability

The present invention can also be applied to an analyzer suitable to measure structural dimension on a sample by an ion beam, a length measuring apparatus using the ion beam, or an inspection device. The present invention can also be applied to a combined instrument of an ion beam processing apparatus and an ion microscope capable of performing high-resolution observation, or a combined instrument of an electron microscope and an ion microscope capable of performing high-resolution observation. The present invention can also be used for an apparatus which fabricates a sample with an ion beam to form a cross section and observes the cross section through an ion microscope, and also for a cross-section observation method. The present invention can also be used for an analyzer and an inspection device which can be used alone to make sample observation with an ion microscope, sample observation with an electron microscope, and elemental analysis and to observe and analyze a defect, a foreign substance, etc.

REFERENCE SIGNS LIST

1 Gas field ionization ion source
2 Ion beam irradiation system column
3 Vacuum sample chamber
5 Condenser lens
6 Beam limiting aperture
7 Beam scanning electrode
8 Objective lens
9 Sample
10 Sample stage
11 Secondary particle detector
12 Ion source vacuum exhaust pump
13 Sample chamber vacuum exhaust pump
14 Ion beam
15 Gas molecule ionizing chamber
16 Compressor unit
17 Apparatus stand
18 Base plate
19 Vibration removal mechanism
21 Emitter tip
22 Filament
23 Filament mount
24 Extraction electrode
25 Gas supply pipe
26 Vacuum bulkhead
27 Aperture
28 Side wall
29 Top plate
30 Laminated heat insulating material
51 Vacuum container
52, 55 Sapphire base
53 Cooling conductor rod
54, 56 Copper mesh wire
60 Electrode
61 Bellows A
62 Bellows B
92 Cooling mechanism control device
93 Lens control device
94 Beam limiting aperture control device
95 Ion beam scan control device
96 Secondary electron detector control device
97 Sample stage control device
98 Vacuum exhaust pump control device
99 Arithmetic processing unit
101, 102, 403, 407, 413, 415, 502, 504 Pipe
103 Support post
400 Compressor unit
401 GM type refrigerator
402, 405, 409, 410, 412, 600 Heat exchanger
404 Transfer tube
406 Cooling conductor
432 Support
433, 434 Bellows
500 Liquid nitrogen container
506 Valve

The invention claimed is:

1. An ion microscope, comprising:
a field ionization ion source which has an emitter tip having a needle-shaped end, an ionizing chamber in which the emitter tip is arranged, a pipe for supplying gas molecules to the vicinity of the end of the emitter tip, and an extraction electrode for generating an electric field to ionize the gas molecules in the vicinity of the emitter tip end;
a sample stage on which a sample is placed;
a lens for focusing an ion beam from the gas field ionization ion source onto the sample;
a base for supporting the field ionization ion source, the sample stage and the lens;
an apparatus stand; and
a vibration removal mechanism disposed between the base and the apparatus stand,
the ion microscope, comprising:
a cooling heat conductor thermally connected partly to the field ionization ion source;
a heat exchanger thermally coupled to the cooling heat conductor;
a refrigerator independent of the base;
a two-way pipe for circulating a refrigerant between the heat exchanger and the refrigerator; and
a vacuum insulated pipe which houses at least part of the two-way pipe, wherein:
one end of the vacuum insulated pipe is supported by the base.

2. The ion microscope according to claim 1, further comprising a first two-way pipe in which a very low temperature refrigerant for cooling the field ionization ion source flows; and
a second two-way pipe which is disposed to thermally shield the first two-way pipe and in which a refrigerant having a temperature higher than that of the very low temperature refrigerant flows.

3. The ion microscope according to claim 1, wherein the one end of the vacuum insulated pipe supported by the base is provided with a bulkhead through which the cooling heat conductor is disposed, the heat exchanger is arranged within the vacuum insulated pipe, and the heat exchanger is vacuum-isolated from the field ionization ion source.

4. The ion microscope according to claim 3, wherein the vacuum bulkhead has a honeycomb structure.

5. The ion microscope according to claim 1, further comprising:
a base mount for supporting the emitter tip, and
a deformable mechanism element for connecting the base mount and the extraction electrode, wherein:

the ionizing chamber is comprised of at least the base mount, the extraction electrode and the deformable mechanism element, and the ionizing chamber is movable.

6. The ion microscope according to claim 1, wherein the vacuum insulated pipe is divided into at least two, one of the vacuum insulated pipes is supported by the base, the other is supported by the apparatus stand, and the divided vacuum insulated pipes are vacuum-connected with a bellows.

7. The ion microscope according to claim 1, wherein the vacuum insulated pipe is provided with a liquid nitrogen circuit to cool the inside of the vacuum insulated pipe.

8. The ion microscope according to claim 7, wherein the liquid nitrogen circuit and the two-way pipe are thermally integrated with each other within the vacuum insulation container.

9. The ion microscope according to claim 1, wherein the one end of the vacuum insulated pipe supported by the base is provided with the bulkhead through which the two-way pipe is disposed, and the vacuum insulated pipe interior is vacuum-isolated from the field ionization ion source.

10. The ion microscope according to claim 1, including an operation mode to circulate a refrigerant in the two-way pipe when a vacuum container including the field ionization ion source, the sample stage and the lens is baked.

* * * * *